United States Patent [19]

Soloway et al.

[11] Patent Number: 4,742,183
[45] Date of Patent: May 3, 1988

[54] METHODS AND TECHNIQUES FOR FABRICATING FOLDABLE PRINTED CIRCUIT BOARDS

[75] Inventors: Richard Soloway, Lido Beach; Richard Farrell, West Babylon, both of N.Y.

[73] Assignee: Napco Security Systems, Inc., Copiague, N.Y.

[21] Appl. No.: 923,048

[22] Filed: Oct. 24, 1986

[51] Int. Cl.⁴ ............................................. H05K 1/18
[52] U.S. Cl. .................................. 174/68.5; 361/412; 361/415
[58] Field of Search ............... 174/68.5; 361/395, 412, 361/415

[56] References Cited

U.S. PATENT DOCUMENTS

| | | | |
|---|---|---|---|
| 4,085,502 | 4/1978 | Ostman | 174/117 FF X |
| 4,227,238 | 10/1980 | Saito | 361/415 X |
| 4,316,235 | 2/1982 | Latasiewicz | 174/68.5 X |
| 4,335,272 | 6/1982 | Pittenger | 174/68.5 |
| 4,388,672 | 6/1983 | Skill | 361/412 |

FOREIGN PATENT DOCUMENTS 4324031 10/1943 Japan ................................ 174/68.5
2061623 10/1979 United Kingdom ............... 361/413

OTHER PUBLICATIONS

General Electric, Textolite laminates pamphlet L-CD-L-458 received in PTO 03/59, 4 pages.

Primary Examiner—R. R. Kucia
Attorney, Agent, or Firm—Arthur L. Plevy

[57] ABSTRACT

There is disclosed a method of fabricating a folded printed circuit board. The method includes the steps of forming first and second apertures in a rigid board along a common line which line is parallel to a side edge of a board then scoring the line to form a break area for said board. The next step includes the formation of terminal areas on each side of the apertures on opposite sides of the line and forming component terminal areas for said board. Automatically inserting said components into said rigid board, while automatically inserting larger diameter wire conductors into said terminal areas to bridge said apertures, breaking the board along the scored line and folding the board with said wires across the apertures forming hinge assemblies for said board.

3 Claims, 1 Drawing Sheet

METHODS AND TECHNIQUES FOR FABRICATING FOLDABLE PRINTED CIRCUIT BOARDS

BACKGROUND OF THE INVENTION

This invention relates to printed circuit boards in general and more particularly to a method of fabricating a foldable printed circuit board.

Printed circuit boards which are folded have long been known in the art and essentially provide a means for minimizing space requirement in electronic packages or housings which employ printed circuit wiring. The prior art is replete with a number of patents which are directed to foldable printed circuit boards.

According to such prior art techniques, these boards have been built with multiple rigid board sections which are bonded to flexible tape circuitry. Manufacturing of such assemblies is expensive because the assemblies require special support fixtures and other devices to enable them to be properly fabricated. The prior art is cognizant of such problems and there have been many attempts to provide folded boards in order to conserve space and to enable electronic components mounted on such printed circuit boards to be placed in housings having a fixed service area.

For examples of such suitable prior art, reference is made to U.S. Pat. No. 3,716,846, issued on Feb. 13, 1973 and entitled CONNECTOR SHEET WITH CONTACTS ON OPPOSITE SIDES by P. Volckart, et al. This patent basically shows a connector sheet or band with a printed circuit only on the front surface. The sheet has a marginal portion bent along a fold line upon the rear surface. Input and output connectors extended across the fold line and are arranged symmetrically and form registering electrically connected contact portions in the front and the rear of the connector sheet.

As one can ascertain by reference to the above-noted patent, in order to make the contact and permit folding of the board, the reference employs conductor strips which are extremely thin devices. The problem with such strips is that if the board is folded and reopened and folded again, the strips break and are damaged due to such multiple folding and unfolding operations. Hence these boards are relatively fragile and are not meant for rugged operation.

Apart from these factors is that the board based on the conductor strips utilized to implement the fold enable very low current levels to be carried by the conductor strips thereby adversely affecting the boards in regard to biasing voltage supplies, ground returns and so on.

U.S. Pat. No. 3,971,127 issued on July 27, 1976 to W. J. Giguere and is entitled A METHOD OF FABRICATING A PRINTED WIRING BOARD ASSEMBLY. This patent again describes a method of fabricating a folded printed wire board assembly which includes cutting an aperture into a rigid board and bonding a flexible circuit tape to one side of a board so that the tape bridges the aperture.

Essentially, in regard to this patent, this is very similar to prior art techniques where the connectors across the aperture are circuit tape and hence the circuit tape employed is very fragile and does not enable one to constantly open and close the board nor does the circuit tape provide a mechanical bonding assembly for one side of the board to the other. These are various other patents which show various other techniques providing folded board assemblies as for example U.S. Pat. No. 3,819,989, issued on June 25, 1974 entitled PRINTED WIRING BOARD ASSEMBLY to D. P. Braune which shows a printed wiring circuit board assembly fabricated from a single blank flexible tape carrying a plurality of conductors extending to circuitry carried by the circuit boards. In this patent the boards are arranged at right angles to a main tape at the end of tape tabs carrying branching conductors to board circuitry. Tape tabs are then folded and refolded so that the boards come to rest in mutually parallel planes perpendicular to the main tape.

Other patents such as U.S. Pat. No. 4,066,851 and U.S. Pat. No. 4,149,219 as well as U.S. Pat. No. 4,216,523 relate to various techniques showing printed circuit boards employing fold lines or other conductors to enable folding of the board to conserve space in subsequent housing assemblies.

In any event, as one can ascertain from the above prior art, most of the techniques employing foldable boards used circuit tape or other very thin flexible conductors in order to enable folding of the board. The prior art techniques were difficult to implement and resulted in relatively fragile assemblies with permitted folding but did not permit easy access or did not permit the continuous folding and unfolding of the board. Furthermore, the conductors employed were difficult to fabricate as well as the fact that the boards were difficult to fabricate, and due to the nature of the circuit tapes, these circuits were not capable of carrying high current and did not provide any mechanical support to the folded assembly.

It is of course apparent that printed circuit boards which are employed in commercial products require the necessity to implement repairs on such boards and essentially test and repair such boards by the continuous folding and unfolding of the boards. This of course requires very rigid conductors connecting the boards together and furthermore which conductors would provide both mechanical and electrical connections for the board. It is also apparent that one needs to fabricate such boards as rapidly as possible using high speed equipment in order to produce a great number of boards with a minimum of time and operations.

It is therefore an object of the present invention to provide an improved printed circuit board which is capable of being folded which can be manufactured inexpensively and accurately.

It is a further object to provide a foldable printed circuit board which is extremely rugged while providing good electrical contact between the folded halves and further enabling the continuous folding and unfolding of the board for test purposes.

It is a further object to provide a foldable printed circuit board which can be fabricated utilizing conventional high speed techniques for printed board fabrication such as for use with automatic insertion machines which allows components to be rapidly placed on a printed circuit board.

BRIEF DESCRIPTION OF THE PREFERRED EMBODIMENT

A method of fabricating a foldable printed circuit board forming first and second apertures in a rigid board along a common line, parallel to a side edge of said board, scoring said line to form a break area for said board, forming terminal areas on each side of said apertures on opposite sides of said line, and forming component terminal areas for said board, automatically inserting components into said component terminal areas of said rigid board while automatically inserting large diameter wire conductors into said terminal areas to bridge said apertures, breaking said board along said scored line, folding said board with said wires across said apertures forming bridge assemblies for said board.

DETAILED DESCRIPTION OF THE FIGURES

Figure 1:
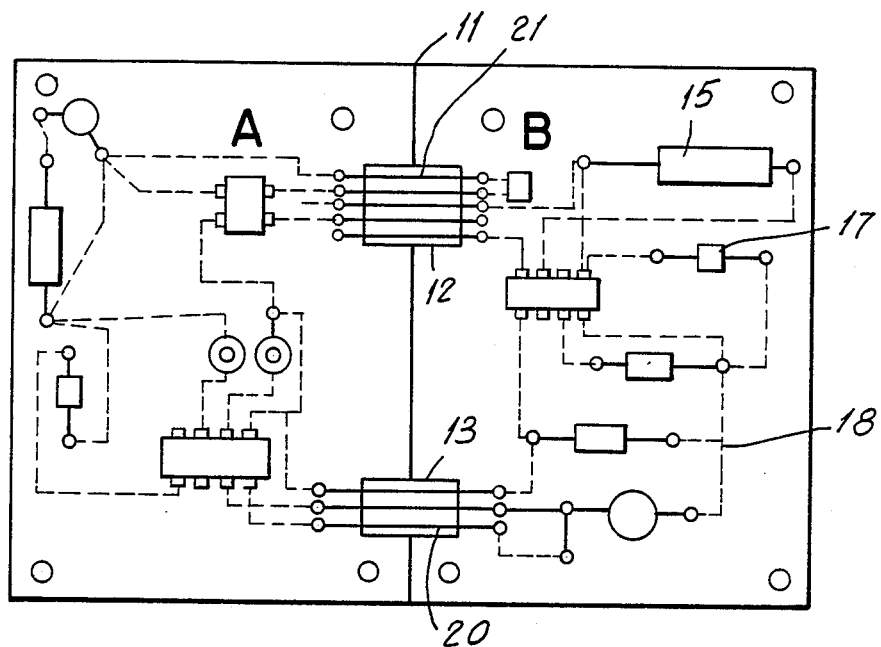
FIG. 1 is a top plan view of a printed circuit board according to this invention.

Referring to FIG. 1, there is shown a printed circuit board assembly 10 which can be fabricated by conventional techniques.

As seen in FIG. 1, the printed circuit board assembly consists of a left section A and a right section B. The fabrication of the printed circuit board 10 is such that it is fabricated as a single board with a relatively central scored line section 11. Section 11 intersects a first aperture 12 and a second aperture 13. Each aperture as 12 and 13 are formed in the boards prior to the insertion of components therein. The apertures 12 and 13 are rectangular with the aperture 12 being of a larger area than the aperture 13 and contain a greater number of wires. Essentially, as seen in the printed circuit board is a conventional type of board where upon the top surface there are components such as 15 and 17, all interconnected together via printed circuit land areas as 18 and so on to form a printed circuit. Seen crossing the apertures as 12 and 13 are rigid conductors or wires as 20 and 21. These wires as will be explained are of a relatively large diameter and made of a good conductive material. The printed circuit board 10 is made of an insulating material such as a glass epoxy which a material generally used in printed circuit construction.

Figure 2:
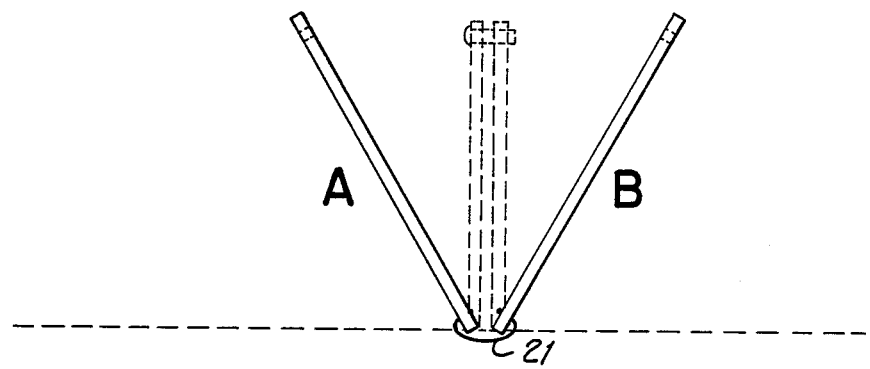
FIG. 2 is a schematic view showing the folding capabilities of the board of FIG. 1.

The wires which bridge the apertures as for example wires 20 and 21 are utilized to provide mechanical rigidity to the board while further serving to provide electrical connections between the left and the right sections A and B. As indicated, the board of FIG. 1 is fabricated with apertures 20 and 21 and has a scored line 11. After insertion of the components and the wires into the board and after all connections are made, the board is tested as shown in FIG. 1 as a planar assembly. This allows one to perform test operations very rapidly and very simply. After the board has been accepted, it is then broken along the scored line 11 and folded as for example shown in FIG. 2. The relatively large diameter conductors as 20 and 21 serve as an excellent mechanical hinge while further allowing one to continuously fold sections A and B in regard to the vertical plane as shown in dashed lines in FIG. 2 and then to unfold sections A and B in regard to the horizontal line as shown in FIG. 2. The board 10 is conventionally fabricated and has a top surface including through holes for accommodating the axial component leads. The bottom of the board consists of a series of printed circuit interconnecting lead area (shown dashed) to interconnect the inserted components in circuit. The bottom of the board 10 after component insertion is placed in a molten solder bath or by using a wave soldering technique to secure the inserted components to the printed circuit interconnecting lead or terminal areas.

The rigid conductors as 20 and 21 which are made of copper or another good conducting metal perform the dual purpose of enabling one to provide electrical connections between sections A and B and to provide a good mechanical hinge assembly which allows one to unfold and refold the board many times without the fear of breaking or fracturing the conductors as 20 and 21. The wires are of such a diameter than the two sections A and B will be supported in the horizontal plane by the wires to therefore define the position of the sections with respect to one another.

A major advantage associated with the above technique is that it allows one to use labor saving component insertion equipment. This equipment is sold by many companies and essentially allows one to insert electrical components into printed circuit boards in a rapid and reliable manner. Such equipment has been referred to in the prior art as automatic insertion equipment. There are many companies who manufacture such equipment and an example of one company is the Universal Instruments Corp. of Binghamton, N.Y. This company and many other companies manufacture equipment which essentially allows the rapid insertion of printed circuit assemblies into boards in a predetermined or controllable manner.

This equipment and assembly machines reduce printed circuit board assembly costs to a fraction of typical costs by utilizing other techniques. For example, by using such machines, one can cause the insertion of over 2,000 components an hour which components can be of all different types such as axial lead resistors, axial lead capacitors and so on.

Figure 3:
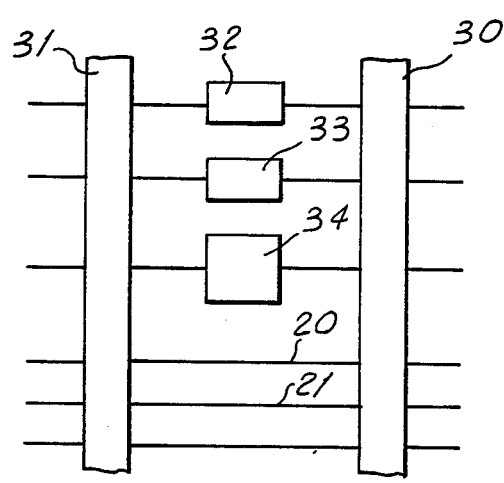
FIG. 3 is a partial top view depicting a tape assembly for holding components which will be inserted into a printed circuit board by an automatic insertion machine of the type existing in the prior art.

Referring to FIG. 3, most machines operate by prelocating components between two tape sections which are sections 30 and 31. The components such as component 32 may be a resistor, component 33 a capacitor and component 34 an axial lead resistor or some other device. The wires which bridge the apertures 12 and 13 as wires 20 and 21 are then inserted between the tapes as shown.

In regard to such machines, the diameter of the axial leads associated with the components or the diameters of the wire can be 0.015 of an inch to 0.0375 of an inch. As one can therefore ascertain, the wires such as wires 20 and 21 can be fairly large and therefore are capable of carrying a large current, plus the fact that they are extremely rugged and can be bent and rebent in many instances. The wires which for example may be six wires for aperture 12 and three wires for aperture 20, therefore serve as extremely reliable mechanical hinge assemblies therefore assuring that the board A section will always be aligned properly with the board B section. In any event, the technique above allows the automatic and immediate insertion of such wires utilizing automatic insertion machines by properly positioning the wires between the tapes as 30 and 31 as for example shown in FIG. 3.

Thus the technique allows one to utilize folded boards with a minimum of effort while further allowing one to utilize automatic insertion machines to therefore achieve large volume component insertion in small periods of time. The leads as 20 and 21 bridge the corresponding apertures as 12 and 13 also can serve as test points. This is so as the wires which formulate the conductive leads are conductive and essentially can be accessed by means of probes and various other devices to monitor the current flowing through the board, the voltages on the board and various other test points. As one can ascertain from FIG. 1, each and every wire is part and parcel of a circuit connection which connects section A to section B. The advantages of the above-noted construction are many, but a major advantage resides in the fact that it permits one to utilize a automatic insertion machine and to utilize wires of relatively large diameter which wires are extremely rugged, therefore allowing one to continuously fold and unfold the boards.

The wires as indicated above also act as test points and are capable of carrying large amounts of current as compared to the prior art techniques. The boards can easily be folded after the board is broken along the scored line 11. In any event, as indicated above, prior to breaking the boards, one can test the entire unit as a completely planar assembly which therefore facilitates the use of automatic test equipment due to the fact that such equipment operates in a single plane.

In any event, the board can easily be repaired due to the fact that it can be folded back into the horizontal plane as shown in FIG. 2 and therefore can again be accessed by the same type of test equipment that tested the board in the first instance and even after the board was broken into sections A and B along the scored line 11. It should therefore be obvious to those skilled in the art that the above construction and technique will allow for an improved operation and provide a superior apparatus to those of the prior art.

What is claimed is:

1. A printed circuit board apparatus comprising:
a planar rigid board separated along a scored separation line across said board into first and second sections, said planar rigid board having first and second rectangular apertures symmetrically disposed about said scored separation line, with said first aperture being of a larger area than said second aperture, said first and second apertures each providing rectangular indentations along said scored separation line substantially extending into said first and second sections, said rectangular indentations defining notched rectangular indentations along said scored separation line in each of said first and second sections having a longitudinal extent along said scored separation line which taken separately and in combination is substantially less than the longitudinal extent of said scored separation line between said first and second sections, said board containing on a top surface a plurality of component terminals adapted to receive electrical components by automatic insertion means, and a bottom surface manifesting a plurality of conductive lead areas interconnecting said terminals in a circuit pattern with said apertures having terminals on both sides for both first and second sections with said terminals interconnected by large diameter conductor wires straddling said apertures, said conductor wires serving to interconnect said first and second sections and further serving as hinge members when said board is folded along said scored line to form first and second sections hinged together via said wires with said first aperture accommodating a greater number of wires than said second aperture, said conductor wires being present in sufficient number and having a diameter which is sufficient to support said first and second sections in a horizontal plane and define the position of each of said first and second sections with respect to the other.

2. The printed circuit board apparatus according to claim 1, wherein said board is fabricated from a glass epoxy.

3. The printed circuit board apparatus according to claim 1, wherein said large diameter conductor wires are between 0.015–0.037 inches in diameter.

* * * * *